United States Patent [19]
Murayama
[11] 3,725,743
[45] Apr. 3, 1973

[54] MULTILAYER WIRING STRUCTURE

[75] Inventor: Yoshimasa Murayama, Kodaira, Japan

[73] Assignee: Hitachi, Ltd., Chiyoda-ku, Tokyo, Japan

[22] Filed: May 19, 1971

[21] Appl. No.: 144,789

[52] U.S. Cl...................317/101 A, 29/589, 117/217, 317/234

[51] Int. Cl...............................................H01l 19/00

[58] Field of Search..........317/101 A, 234 M, 234 N; 29/589, 591; 117/217

[56] References Cited

UNITED STATES PATENTS

| | | | |
|---|---|---|---|
| 3,436,615 | 4/1969 | Finlayson | 317/234 M |
| 3,388,301 | 6/1968 | James | 317/101 A |
| 3,331,994 | 7/1967 | Kile, Jr. | 117/217 |
| 3,290,565 | 12/1966 | Hastings | 317/234 R |
| 3,287,612 | 11/1966 | Lepselter | 317/235 R |

*Primary Examiner*—David Smith, Jr.
*Attorney*—Craig, Antonelli & Hill

[57] ABSTRACT

A multilayer wiring structure and its method of production, in which the multilayer wiring structure comprises a first wiring conductive layer disposed on the surface of an insulative substrate, an insulative layer disposed on the first wiring conductive layer and provided with an opening for exposing a predetermined part of the conductive layer, an interconnecting conductive layer disposed in the opening part of the insulating layer, the interconnecting conductive layer being thicker than the insulative layer, and a second wiring conductive layer disposed on the insulative layer and the interconnecting conductive layer.

14 Claims, 3 Drawing Figures

PATENTED APR 3 1973 3,725,743

INVENTOR.
YOSHIMASA MURAYAMA
BY Craig, Antonelli & Hill
ATTORNEYS

MULTILAYER WIRING STRUCTURE

DETAILED DESCRIPTION OF THE INVENTION

This invention relates to improved multilayer wiring layers used for thin film circuits, thick film circuits, monolithic integrated circuits, hybrid integrated circuits, large scale integration, etc. In recent years, research and development have been advancing to achieve higher integration density in the integrated circuit. In this field, problems exist as to wiring, especially multilayer wiring made between circuit elements or among electrode leads and circuit elements, to meet the requirements of arbitrary electric circuits.

In the prior art, a short between conductive layers is prevented by interposing an insulative layer, such as an $SiO_2$ layer between the conductive layers. In the case of connections between the conductive layers in accordance with a desired circuit, the conductive layers are interconnected with each other through an opening disposed in the insulative layer.

The interconnection between wiring conductive layers is realized in the prior art as shown in FIG. 1, wherein a first wiring conductive layer 2 (hereinafter referred to as first conductive layer) is disposed on a substrate 1, the conductive layer 2 is covered with a desired insulative layer 3, an opening 4 is formed in the insulative layer 3 by photo-etching technique to expose a predetermined part of the first conductive layer 2, a second wiring conductive layer 5 (hereinafter referred to as second conductive layer) with a thickness nearly equal to that of the insulative layer 3, is disposed on said insulative layer 3, and the first and second conductive layers 2 and 5 are electrically connected to each other through the opening 4 in insulative layer 3. Usually the first and second conductive layers 2 and 5 are formed by a vacuum evaporation process or the like.

It has been found experimentally that the multilayer wiring interconnecting method as shown in FIG. 1 gives rise to certain problems; for example, the growth of the conductive layer is slow in the region around the opening 4 of insulative layer 3 as indicated by the arrow 6, and the conductive layer tends to cause cracks due to internal stresses or other reasons. If the crack is present in the second wiring conductive layer 5, the resistance thereof is increased in the cracked area, thereby producing heat and the electrical characteristics of this region become unstable.

It has also been known experimentally that if the thickness of the second conductor layer 5 is made more than about twice that of the insulative layer 3, the conductor is thoroughly formed in the region around the opening 4 of the insulative layer 3, and such conductive layer 3 is then kept free of cracks due to external stresses after the growth of the conductor. In the prior art, however, difficulties then exist in etching the conductive layer 5 according to precise and complicated wiring patterns because the conductive layer 5 is too thick.

In view of the foregoing, a general object of this invention is to provide a novel conductive layer interconnecting structure and its production method, in connection with multilayer wirings for conductive layers used in thin film circuits, thick film circuits, integrated circuits and the like, wherein the conductive layer interconnecting structure is characterized by its excellent electrical characteristics and simplicity in the method of its production.

Briefly, the multilayer wiring structure of this invention comprises: a substrate of a thin film circuit, of a thick film circuit, of a monolithic integrated circuit or the like; a first wiring conductive layer disposed on the surface of the substrate; an insulative film covering the first wiring conductive layer and provided with an opening for exposing a part of the wiring conductive layer; an interconnecting conductive layer disposed inside the opening area of the insulative layer and made of the same material as that of the interconnecting conductive layer, and the interconnecting conductive layer being thicker than the insulative layer; and a second wiring conductive layer disposed on the insulative layer, the second wiring conductive layer covering the interconnecting conductive layer and made of the same material as that of the first wiring conductive layer.

More specifically, in a preferred embodiment of the present invention, the multilayer wiring structure of this invention is formed in such manner that, for improvements as regards the yield rate and electrical characteristics, the wiring conductive layer is formed of aluminum, the insulative thin film covering the first wiring conductive layer is formed of silicon oxide or glass including a metal oxide, the interconnecting conductive layer filling the opening of the silicon oxide film or glass film is made of aluminum, and the interconnecting conductive layer is formed to be more than 1.3 times thicker than the silicon oxide or glass film.

According to this invention, it is desirable that the material used as the first and second wiring conductive layers and as the interconnecting conductive layer has certain characteristics, namely, low in specific resistance, high in melting point, high in bonding force on the insulation layer, small in the rate of temperature expansion, and nearly the same thermal expansion coefficient as the insulative layer, and, additionally, makes available a high workability. To fulfill these requirements, aluminum is the most desirable material. Aluminum has a high conductivity and high workability, and is capable of forming a desirable ohmic contact with certain semiconductors especially with silicon and germanium. Hence, aluminum is widely used as the wiring conductive layer in integrated circuits, in large scale integration, thin film circuits and the like.

Besides aluminum, there are available various other metals such as Au, Ag, Cu, Ni, Cr, T, W, Mo and Mg for the wiring conductive layer. Also available are double layers and triple layers formed by a combination of these metals. The aluminum layer is better than those of these other metals with respect to the aforementioned characteristics. There are still other materials available, which, however, are more undesirable compared with the above materials in view of their electrical or mechanical characteristics.

For use as the material of the insulative layer, and $SiO_2$ film, a glass film such as phospho-silicate glass, boro-silicate glass and alumino-silicate glass film, or a metal oxide film, such as $Al_2O_3$, $TiO_2$ and ZrO film, is suitable in view of its workability, processing qualities and mechanical strength.

The first and second wiring conductive layers are desired to be thin in view of the desired workability. However, if too thin, these wiring conductive layers will increase the resistance and produce heat. Considering these points, it is desirable that the thickness of the first and second wiring conductive layers be in the range of about 0.4 to about 3$\mu$. The thickness of the insulative layer interposed between the first and second conductive layers is chosen from the range of about 4,000 A to about 10$\mu$. If the thickness thereof is smaller than 4,000 A, it is very likely to cause pinholes in the insulative layer and to lower the yield rate. The lower limit of the thickness is defined by the thickness of the first wiring conductive layer; the lower limit of the thickness required is nearly the same as that of the first wiring conductive layer. For example, when the first wiring conductive layer is 1$\mu$ thick, the thickness of the insulative layer must be more than 1$\mu$. Furthermore, if the first wiring conductive layer is thicker than 10$\mu$, the workability on the layer is lowered and it tends to cause cracks.

When the thickness of the interconnecting conductive layer is nearly the same as that of the insulative layer, cracks tend to be produced in the conductive layer around the opening of the insulative layer. When the interconnecting conductive layer becomes thicker than the insulative layer, the growth of the conductor around the opening of the insulative layer starts. Once the growth starts, the conductor at the region around the opening thereof, grows at a relatively high velocity, and almost no cracks are produced in this region.

Especially when aluminum is used for the interconnecting conductive layer, aluminum grows perfectly around the opening of the insulative layer and no crack is produced therein, provided that the thickness of the aluminum layer is more than 1.3 times that of the insulative layer.

According to this invention, it is desirable that the interconnecting conductive layer be sufficiently thicker than the insulative layer for the purpose of preventing cracks. On the other hand, considering the material loss, workability and period for production, the thinner interconnecting conductive layer is more desirable. Therefore, the thickness of the interconnecting conductive layer is to be determined so that the cracks are avoided and the workability is increased. Practically, to satisfy these requirements, the thickness of the interconnecting conductive layer is in the range of about 1.3 to about 3 times that of the insulative layer.

When aluminum is used for the first and second wiring conductor, it is important that aluminum is also used for the interconnecting conductor disposed in the opening of the $SiO_2$ layer, because the contact resistance between the interconnecting conductor and the first or second wiring conductive layer is lowered, and a good mechanical contact between the two conductive layers can be obtained. However, when aluminum is used for the first and second wiring conductive layers, and gold is used for the interconnecting conductive layer, an aluminum-gold alloy ($AuAl_2$) is formed in the boundary between the aluminum layer and gold layer and, as a result, the contact resistance is increased, and the mechanical strength of the contact region is remarkably lowered. Further, if chromium is used instead of gold for the interconnecting conductive layer, aluminum is diffused into the chromium layer and the resistance in the junction region increases.

According to this invention, an interconnecting conductive layer thicker than the insulative layer is deposited into the opening part of the insulative layer beforehand and, hence, no cracks are produced in the regions around the opening of the insulative layer without having to increase the thickness of the second wiring conductive layer. In other words, the second wiring conductive layer can be made as thin as possible within the specified limit values. This serves to improve the workability and increase the yield rate of thin film circuits, thick film circuits, integrated circuits and the like.

EXAMPLE 1

Figure 1:
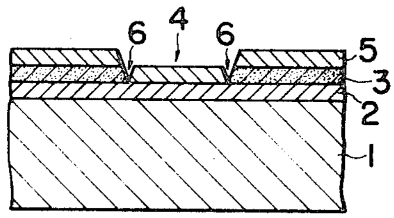
FIG. 1 is a longitudinal sectional elevational view, illustrating the conventional multilayer wiring structure.
Figure 2:
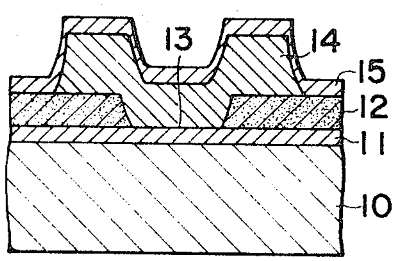
FIG. 2 is a longitudinal sectional elevational view, illustrating a multilayer wiring structure of this invention.

In FIG. 2, reference numeral 10 denotes a semiconductor substrate of an IC, LSI or the like, or the substrate of a thin film integrated circuit or thick film circuit. In the IC or LSI substrate, the surface is is covered with a protective film such as an $SiO_2$ film, and in the thin film circuit substrate or thick film circuit substrate, the surface of the ceramic substrate is covered with a glazed, surface-smoothed glass layer. This embodiment relates to the thin film wiring substrate of hybrid integrated circuits.

A 2.5$\mu$ thick aluminum layer is formed on a substrate as mentioned above by the vacuum evaporation technique, and the aluminum layer is photo-etched whereby a first wiring conductive layer 11 is formed. In this embodiment, phosphoric acid is used as the etching solution for the aluminum evaporation layer. Then a 5$\mu$ thick alumino-silicate glass layer 12 is formed on the conductive layer 11 by a conventional high frequency sputtering process.

An opening is formed in the desired part of the glass layer 12 by the photo-etching technique, thereby exposing the desired part 13 of the first wiring conductive layer 11. An 8$\mu$ thick aluminum layer is formed on the whole surface of the substrate by vacuum evaporation technique, and then the whole aluminum layer excepting the desired part 14 is removed by etching process. The aluminum layer 14 fills the inside of the opening of the glass layer 12 and also covers the regions around the opening. The aluminum layer 14 serves as an interconnecting conductive layer having a thickness about 1.3 times or more than that of the glass layer 12. Therefore, if cracks are produced in the region of aluminum layer 14 around the opening during the evaporation process, such cracks are eliminated toward the end of the process.

After forming the interconnecting conductive layer 14, a 2.5$\mu$ thick aluminum layer 15 is formed on the whole surface of the interconnecting conductive layer 14 by vacuum evaporation technique, and unnecessary parts of the aluminum layer 15 are removed by photo-etching process, thereby forming a second wiring conductive layer 15.

Thus, the first wiring conductive layer 11 is connected electrically to the second wiring conductive layer 15 by way of the interconnecting conductive layer 14. According to this invention, the thickness of the first and second wiring conductive layer and the insulative layer is not limited to the values given in this example. For example, in the case of an integrated circuit (IC) or a large scale integrated circuit (LSI), the thickness of the first conductive layer is reduced by 0.4 to 1$\mu$. Namely, the desirable thickness of the insulative layer is 0.4 to 2$\mu$. The thickness of the conductive layer buried in the opening part of the insulative layer is to be more than that of the insulative layer; practically, the thickness of the buried layer is determined to be about 1.3 to 3 times that of the insulative layer in consideration of yield rate and workability.

EXAMPLE 2

Figure 3:
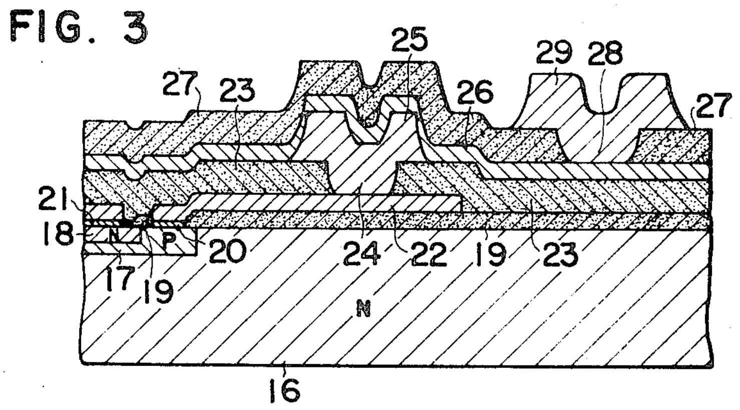
FIG. 3 is a longitudinal sectional elevational view showing the multilayer wiring part of a monolithic integrated circuit of this invention.

FIG. 3 shows an embodiment of this invention applied to a monolithic integrated circuit wherein only the essential part thereof is shown for explanatory simplicity.

In FIG. 3, reference numeral 16 indicates an N-type silicon substrate, and reference numerals 17 and 18 a P-type impurity diffusion layer and an N-type impurity diffusion layer, respectively, formed according to the so-called planar process as known in the art of semiconductor production, wherein an impurity is diffused by way of a mask of an $SiO_2$ film. Reference numeral 19 denotes an $SiO_2$ film 6,000 A thick, used for forming the regions 17 and 18. This $SiO_2$ layer may be formed on the surface of the substrate after removing completely the $SiO_2$ layer used as the mask, or instead of a pure $SiO_2$ layer, $SiO_2$-$P_2O_5$ is deposited on the surface of $SiO_2$ layer. In such double layer structure, the electrical characteristics of the semiconductor device can be stabilized. Reference numerals 20 and 21 are electrodes connected to the surfaces of the P-type diffusion layer 17 and N-type diffusion layer 18. Reference numeral 22 denotes a 5,000 A thick, first wiring conductive layer formed by depositing aluminum by evaporation on the surface of the substrate and by removing the unnecessary parts by a photo-etching process. One end of the first conductive layer 22 is connected to a respective electrode.

The semiconductor device formed in the above manner is known as planar transistor or planar diode. The multilayer wiring of this invention is made on such known semiconductor structure in the following manner.

First, a 1$\mu$ thick $SiO_2$ layer 23 is deposited on the surface of the semiconductor substrate by sputtering technique. A certain specific amount of oxide such as $Al_2O_3$, $B_2O_3$, $P_2O_5$ and the like may be added to the $SiO_2$. Experimentally, this arrangement is known to be effective for improving thermal expansion characteristics, the moisture resistivity and the surface electrical characteristics of the semiconductor substrate.

Then, an opening 24 is formed in the corresponding part of the $SiO_2$ layer 23 by photo-etching process, to expose part of the first wiring conductive layer 22.

After this step, a 1.5$\mu$ thick aluminum layer 25 is deposited on the substrate by evaporation technique, to form an interconnecting conductive layer and the whole aluminum layer excepting the part buried in the opening 24 is removed. Reference numeral 25 denotes an aluminum layer formed in the foregoing manner, which is to serve as an interconnecting conductive layer of this invention. Since this interconnecting conductive layer 25 is 1.5 times thicker than the $SiO_2$ layer, there is no possibility of cracks in this conductive layer in the area around the opening of $SiO_2$ layer.

Then, a 0.5$\mu$ thick aluminum layer 26 is deposited on the insulative layer 23 and the interconnecting conductive layer 25 and the resultant aluminum layer is etched by photo-etching process so that a second wiring conductive layer 26 is formed. This wiring conductive layer 26 is connected electrically to the first conductive layer 22 by way of the interconnecting conductive layer 25.

A 1$\mu$ thick $SiO_2$ layer 27 is deposited on the surface of the substrate by a sputtering process so as to form external electrode leads on the second conductive layer. An opening 28 is formed in the $SiO_2$ layer for exposing an area, on which the external electrodes are deposited. Then a 3$\mu$ thick aluminum layer 29 is formed on the surface thereof by evaporation technique, and then whole surface layer excepting the electrode part 29 is removed.

In the foregoing processes, a multilayer wiring structure and external lead electrodes are formed.

As has been described above, the multilayer wiring structure of this invention is excellent in the electrical characteristics, particularly in the reliability of the wiring connection in the opening region. Furthermore, the multilayer wiring structure of this invention assures a high yield rate and makes available a high productivity in connection with production of IC, LSI and the like.

While I have shown and described several embodiments of the present invention, it is understood that the same is not limited thereto but is susceptible of numerous changes and modifications as known to those skilled in the art and I therefore do not with to be limited to the details shown and described herein, but intend to cover all such changes and modifications as are within the scope of the appended claims.

I claim:

1. A multilayer wiring structure comprising:

a. a substrate of which at least the surface is insulative;

b. a first wiring conductive layer disposed on the surface of said substrate;

c. an insulative layer having an opening for exposing a predetermined part of said first wiring conductive layer and covering said first wiring conductive layer;

d. an interconnecting conductive layer in said opening and made of the same material as that of said first wiring conductive layer, and said interconnecting conductive layer being thicker than said insulative layer;

e. a second wiring conductive layer connected to said interconnecting conductive layer and disposed on said insulative layer, and said second wiring conductive layer being formed of the same material as that of said first wiring conductive layer.

2. A multilayer wiring structure in accordance with claim 1, wherein:

said first and second wiring conductive layers and said interconnecting conductive layer are selected from the group essentially consisting of Al, Au, Ag, Cu, Ni, Cr, Ti, W, Mg and Mo.

3. A multilayer wiring structure in accordance with claim 1, wherein:

said insulative layer is selected from the group essentially consisting of (a) an $SiO_2$ layer or (b) a glass layer including one or two of $Al_2O_3$, $B_2O_3$, $P_2O_5$ or (c) a metal oxide layer such as $Al_2O_3$, $TiO_2$, and ZrO layer or (d) a multilayer formed by a combination of said layers.

4. A multilayer wiring structure in accordance with claim 2, wherein said first and second wiring conductive layer and said interconnecting conductive layer are made of aluminum and said interconnecting conductive layer of aluminum filled into said opening has a thickness more than 1.3 times that of said insulative layer.

5. A multilayer wiring structure in accordance with claim 4, wherein said insulative layer is made of an $SiO_2$ layer.

6. A multilayer wiring structure in accordance with claim 4, wherein the thickness of said interconnecting conductive layer made of aluminum is determined to be about 1.3 to about 3 times that of said insulative layer.

7. A multilayer wiring structure in accordance with claim 4, wherein the thickness of said first and second aluminum wiring conductive layers is about 0.4 to about $3\mu$, and said insulative layer is made of $SiO_2$ having a thickness more than that of said first wiring conductive layer up to about $10\mu$, and the thickness of said aluminum interconnecting conductive layer is about 1.3 to about 3 times that of said insulative layer.

8. A multilayer wiring structure in accordance with claim 1, wherein said substrate has on its surface an $SiO_2$ layer and comprises more than one P-N junction extended to its surface.

9. A method of producing a multilayer wiring structure, comprising:

a. preparing a substrate of which the surface is insulative;
b. coating the surface of said substrate with a first conductive material;
c. photo-etching said conductive material according to a desired pattern to form a first wiring conductive layer;
d. depositing an insulative material on said substrate surface in order to cover said first wiring conductive layer, thereby forming an insulative layer which covers said first wiring conductive layer.
e. forming an opening in said insulative layer to expose a predetermined part of said first wiring conductive layer;
f. depositing on the surface of said substrate a layer made of the same material as that of said first wiring conductive layer to a thickness greater than that of said insulative layer, thereby forming a second conductive layer;
g. removing by etching said second conductive layer excepting an area around said opening of said insulative layer to form an interconnecting conductive layer;
h. depositing a third conductive layer on the surface of said substrate, and
i. for removing by etching said third conductive layer according to the desired pattern, thereby forming a second wiring conductive layer.

10. A method of producing a multilayer wiring structure in accordance with claim 9, wherein said insulative layer is formed by sputtering and said conductive layer is formed by vacuum evaporation.

11. A multilayer wiring structure comprising a. a substrate of which at least the surface is insulative;
b. a first wiring conductive layer disposed on the surface of said substrate;
c. an insulative layer having an opening for exposing a predetermined part of said first wiring conductive layer and covering said first wiring conductive layer;
d. an interconnecting conductive layer at least filling said opening and made of the same material as that of said first wiring conductive layer, and said interconnecting conductive layer being thicker than said insulative layer;
e. a second wiring conductive layer covering the exposed portion of said interconnecting conductive layer and disposed on said insulative layer, and said second wiring conductive layer being formed of the same material as that of said first wiring conductive layer.

12. A multilayer wiring structure according to claim 11, wherein said first and second wiring conductive layers and said interconnecting conductive layer are made of aluminum and said interconnecting conductive layer of aluminum filling said opening has a thickness greater than 1.3 times that of said insulative layer.

13. A multilayer wiring structure according to claim 12, wherein said insulative layer is made of silicon dioxide.

14. A multilayer wiring structure according to claim 11, wherein said substrate has a silicon dioxide layer on its surface and comprises a plurality of PN junctions extending to its surface.

* * * * *